US008692741B2

(12) United States Patent
Shin

(10) Patent No.: US 8,692,741 B2
(45) Date of Patent: Apr. 8, 2014

(54) SCAN DRIVING CIRCUIT AND ORGANIC LIGHT EMITTING DISPLAY USING THE SAME

(75) Inventor: Dong Yong Shin, Seoul (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 1517 days.

(21) Appl. No.: 11/506,433

(22) Filed: Aug. 18, 2006

(65) Prior Publication Data

US 2007/0063950 A1    Mar. 22, 2007

(30) Foreign Application Priority Data

Sep. 20, 2005 (KR) .................. 10-2005-0087426

(51) Int. Cl.
*G09G 3/30*  (2006.01)
(52) U.S. Cl.
USPC .............................. 345/76; 345/77
(58) Field of Classification Search
USPC ........... 345/76–83; 315/169.1, 169.3; 377/64, 377/70–81
See application file for complete search history.

(56) References Cited

U.S. PATENT DOCUMENTS

| | | | | |
|---|---|---|---|---|
| 3,898,479 | A | * | 8/1975 | Proebsting ....................... 326/88 |
| 5,222,082 | A | * | 6/1993 | Plus ................................. 377/79 |
| 5,412,334 | A | * | 5/1995 | Katsura .......................... 327/387 |
| 5,510,805 | A | | 4/1996 | Lee |
| 5,517,543 | A | * | 5/1996 | Schleupen et al. ............... 377/79 |
| 5,648,790 | A | * | 7/1997 | Lee .................................. 345/58 |
| 6,339,631 | B1 | * | 1/2002 | Yeo et al. ......................... 377/64 |
| 6,876,352 | B1 | * | 4/2005 | Sato et al. ...................... 345/100 |
| 6,928,135 | B2 | * | 8/2005 | Sasaki et al. .................... 377/64 |
| 6,963,327 | B2 | * | 11/2005 | Kawahata et al. ............. 345/100 |
| 7,027,550 | B2 | * | 4/2006 | Lin ................................. 377/64 |

(Continued)

FOREIGN PATENT DOCUMENTS

| | | |
|---|---|---|
| GB | 2343067 | 4/2000 |
| JP | 2000-155550 | 6/2000 |

(Continued)

OTHER PUBLICATIONS

Office Action of Japanese Patent Application No. 2006-108765 dated Jan. 5, 2010 corresponding to Korean Application No. 10-2005-0087426.

(Continued)

*Primary Examiner* — Alexander Eisen
*Assistant Examiner* — Nelson Lam
(74) *Attorney, Agent, or Firm* — Knobbe, Martens, Olson & Bear, LLP

(57) ABSTRACT

A scan driving circuit and an organic light emitting display using the scan driving circuit are disclosed. The circuit effectively reduces power consumption by removing a flow path of a static current from a stage of each unit. The scan driving circuit is coupled with an input signal line or an output voltage line of a previous stage, and comprises a plurality of stages coupled with a two-phase clock signal input line, a first scan driver sequentially outputs a selection signal and/or a boost signal through the plurality of stages. A second scan driver sequentially outputs an emission signal through the plurality of stages. The first scan driver includes a scan drive unit to output the selection signal, a first boost drive unit to output an odd-numbered boost signal, and a second boost drive unit to output an even-numbered boost signal.

28 Claims, 16 Drawing Sheets

(56) References Cited

U.S. PATENT DOCUMENTS

| | | | |
|---|---|---|---|
| 7,349,519 B2 * | 3/2008 | Jang et al. | 377/64 |
| 2003/0227262 A1 | 12/2003 | Kwon | |
| 2004/0080474 A1 * | 4/2004 | Kimura | 345/82 |
| 2004/0104882 A1 * | 6/2004 | Kitani et al. | 345/100 |
| 2004/0150610 A1 * | 8/2004 | Zebedee et al. | 345/100 |
| 2004/0227718 A1 | 11/2004 | Park | |
| 2005/0078076 A1 | 4/2005 | Kim et al. | |
| 2005/0093464 A1 * | 5/2005 | Shin et al. | 315/169.1 |
| 2005/0156856 A1 * | 7/2005 | Jang et al. | 345/100 |
| 2005/0220263 A1 * | 10/2005 | Moon | 377/68 |

FOREIGN PATENT DOCUMENTS

| | | |
|---|---|---|
| JP | 2003-101406 | 4/2003 |
| JP | 2004-029230 | 1/2004 |
| JP | 2004-029791 | 1/2004 |
| JP | 2004-040809 | 2/2004 |
| JP | 2004-295126 | 10/2004 |
| JP | 2004-348940 | 12/2004 |
| JP | 2005-050502 | 2/2005 |
| JP | 2005-134874 | 5/2005 |
| JP | 2005-338758 | 12/2005 |
| JP | 2006-085118 | 3/2006 |

OTHER PUBLICATIONS

European Examination Report dated Jun. 4, 2012 for European Patent Application No. EP 06 254 876.3 which shares priority of Korean Patent Application No. KR 10-2005-0087426 with captioned U.S. Appl. No. 11/506,433.

* cited by examiner

SCAN DRIVING CIRCUIT AND ORGANIC LIGHT EMITTING DISPLAY USING THE SAME

CROSS-REFERENCE TO RELATED APPLICATIONS

This application claims the benefit of Korean Patent Application No. 2005-87426, filed on Sep. 20, 2005, in the Korean Intellectual Property Office, the disclosure of which is incorporated herein by reference.

BACKGROUND OF THE INVENTION

1. Field of the Invention

The field of the present invention relates to an organic light emitting display, and more particular to a scan driving circuit used for a current programming type organic light emitting display.

2. Description of the Related Art

In general, an organic light emitting display electrically excites a phosphorous organic compound to emit light, and it voltage- or current-drives an array of organic light emitting cells to display images. Such an organic light emitting cell includes an anode of indium tin oxide (ITO), an organic thin film, and a cathode layer of metal.

The organic thin film has a multi-layer structure including an emitting layer (EML), an electron transport layer (ETL), and a hole transport layer (HTL) so as to maintain a balance between electrons and holes and to improve the light emitting efficiency, and further includes an electron injection layer (EIL) and a hole injecting layer (HIL).

Methods for driving the organic emitting cells include the passive matrix driving method, and the active matrix driving method using thin film transistors (TFTs) or metal oxide semiconductor field effect transistors (MOSFETs). The passive matrix display includes an array of cathode lines and anode lines which cross with each other. The active matrix display includes an array of pixels each having a TFT, a capacitor and an ITO pixel electrode to maintain a voltage across the capacitor.

Active matrix driving methods may be classified as voltage programming methods or a current programming methods, according to the type signal used to charge a voltage on a capacitor.

An active matrix type of organic light emitting display includes a display panel, a data driving circuit, a scan driving circuit, and a timing controller. The scan driving circuit receives a scan drive control signal from the timing controller, generates a scan signal, and sequentially provides the scan signal to scan lines of the display panel. That is, the scan driving circuit functions to sequentially generate the scan signal to be provided to the display panel in order to drive pixels included in the display panel.

FIG. 1 is a block diagram showing a conventional scan driving circuit. With reference to FIG. 1, the conventional scan driving circuit includes a plurality of stages ST1 to STn, which are coupled with a start pulse SP input line. The plurality of stages ST1 to STn sequentially shifts a clock signal C in response to a start clock SP so as to generate output signals SO1 to SOn. Each of the second to n-th stages ST2 to STn receives and shifts an output signal of a previous stage as a start pulse for the next stage. Accordingly, the stages generate output signals SO1 to SOn in such a way that the start pulse is sequentially shifted, and provide the output signals for a matrix pixel array.

FIG. 2 is a circuit diagram of a stage in the scan driving circuit shown in FIG. 1. FIG. 3 is an input/output waveform diagram of the stage shown in FIG. 2. Referring to FIG. 2 and FIG. 3, conventionally, each stage constituting a scan driving circuit uses a master-slave flip-flop. When a clock clk is at a low level, such a flip-flop continues to receive an input while maintaining the previous output. In contrast to this, when the clock clk is at high level, the flip-flop maintains an input IN received when the clock clk is at the low level, and outputs the received input, but no longer receives input.

In the aforementioned circuit, an inverter included in the flip-flop has disadvantages which include that a static current flows when the input thereof is at a low level. Furthermore, in the flip-flop, the number of inverters having received a low-level input is the same number as that of inverters having received a high-level input. Accordingly, the static current flows through half of all the inverters in the flip-flop, thereby causing excessive power consumption.

In addition, FIG. 2 shows an embodiment of the inverter circuit. According to this embodiment the high level output of the inverter is determined according to the ratio of resistance values of first and second PMOS transistors M1 and M2. The low level output of the inverter is determined according to the threshold voltage of the first PMOS transistor M1.

Due to manufacturing variations, resistance and threshold parameters vary significantly from transistor to transistor. This is a significant problem because the transistors for organic light emitting displays often use transistors having high manufacturing variability. As a result, the performance of the circuit of FIG. 2 is uncertain. For example, threshold variation causes the low level output of each inverter to vary. As a result, when a low level output from a first inverter having an uncertain value is provided as the input to a second inverter, the second inverter may have a degraded high output level because the uncertain low value results in uncertain pull-up resistance in the first PMOS transistor of the second inverter.

Furthermore, in the inverter, when outputting a high level, a constant electric current flows through both the first and second PMOS transistors M1 and M2. This results in constant power consumption. Also, the constant electric current flowing in the second PMOS transistor M2 causes slower rise times for the inverter output signal.

SUMMARY OF CERTAIN INVENTIVE ASPECTS

Accordingly, it is an aspect to provide a scan driving circuit and an organic light emitting display using the same, which reduce power consumption by removing a current flow path of a static current from a stage of each unit, wherein the scan driving circuit includes a first scan driver for providing a selection signal and/or a boost signal, and a second scan driver for providing an emission signal, wherein the first scan driver includes a scan drive unit for outputting the selection signal, a first boost drive unit for outputting an odd-numbered boost signal, and a second boost drive unit for outputting an even-numbered boost signal.

One embodiment is a scan driving circuit coupled with an input signal line, and including a plurality of stages coupled with a two-phase clock signal input line. The circuit includes a first scan driver configured to sequentially output at least one of a selection signal and a boost signal through two or more of the plurality of stages, and a second scan driver configured to sequentially output an emission signal through two or more of the plurality of stages, where the first scan driver includes a scan drive unit configured to output the selection signal, a first boost drive unit configured to output an odd-numbered boost signal, and a second boost drive unit configured to output an even-numbered boost signal.

Another embodiment is a scan driving circuit coupled with an input signal line and including a plurality of stages coupled with a two-phase clock signal input line. The circuit includes a first scan driver configured to sequentially output at least one of a selection signal and a boost signal through two or more of the plurality of stages, and a second scan driver configured to output an emission signal through two or more of the plurality of stages, where the first scan driver includes a first scan/boost drive unit configured to output odd-numbered selection and boost signals, and a second scan/boost drive unit configured to output even-numbered selection and boost signals.

Another embodiment is an organic light emitting display including a pixel portion having a plurality of pixels coupled to selection signal lines, data lines, emission signal lines, and boost signal lines. The display also includes a data driving circuit configured to provide a data signal to the data lines, and a scan driving circuit coupled with an input signal line, and including a plurality of stages coupled with a two-phase clock signal input line. The scan driving circuit includes a first scan driver configured to sequentially output at least one of a selection signal and a boost signal through two or more of the plurality of stages, and a second scan driver configured to sequentially output an emission signal through two or more of the plurality of stages, where the first scan driver includes a scan drive unit configured to output the selection signal, a first boost drive unit configured to output an odd-numbered boost signal, and a second boost drive unit configured to output an even-numbered boost signal.

Another embodiment is an organic light emitting display including a pixel portion having a plurality of pixels coupled to selection signal lines, data lines, emission signal lines, and boost signal lines. The display also includes a data driving circuit configured to provide a data signal to the data lines, and a scan driving circuit coupled with an input signal line and including a plurality of stages coupled with a two-phase clock signal input line. The scan driving circuit includes a first scan driver configured to sequentially output at least one of a selection signal and a boost signal through two or more of the plurality of stages, and a second scan driver configured to output an emission signal through two or more of the plurality of stages, where the first scan driver includes a first scan/boost drive unit configured to output odd-numbered selection and boost signals, and a second scan/boost drive unit configured to output even-numbered selection and boost signals.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF CERTAIN INVENTIVE ASPECTS

Figure 1:
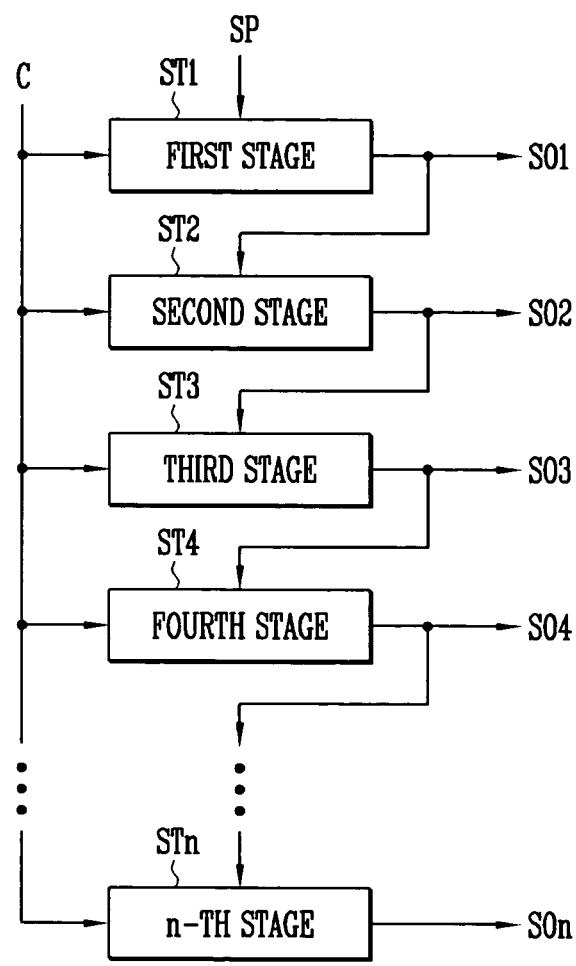
FIG. 1 is a block diagram showing a conventional scan driving circuit.
Figure 2:
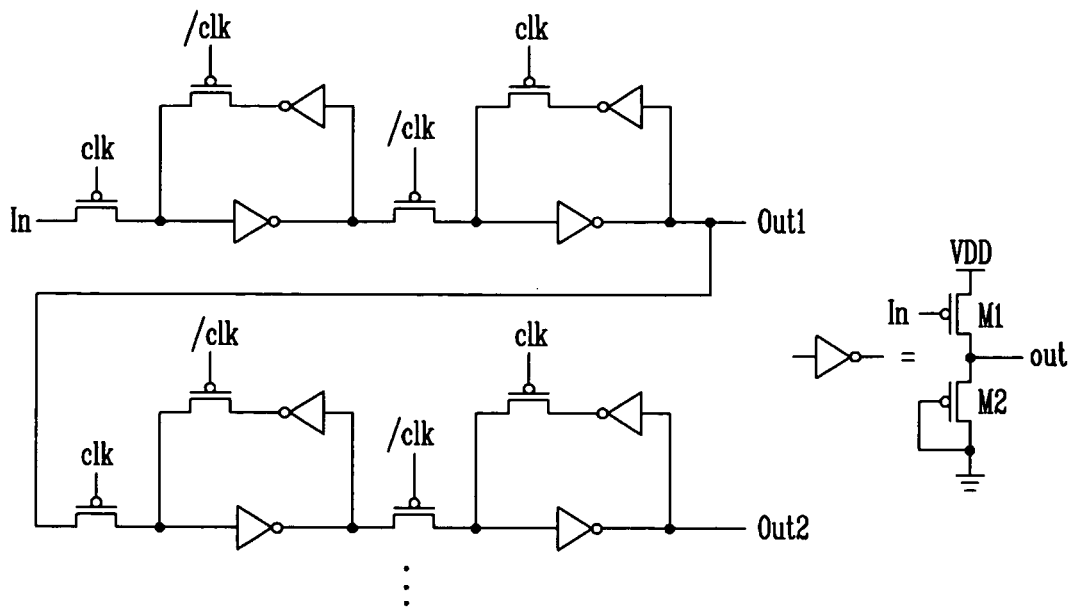
FIG. 2 is a circuit diagram of a stage in the scan driving circuit shown in FIG. 1.
Figure 3:
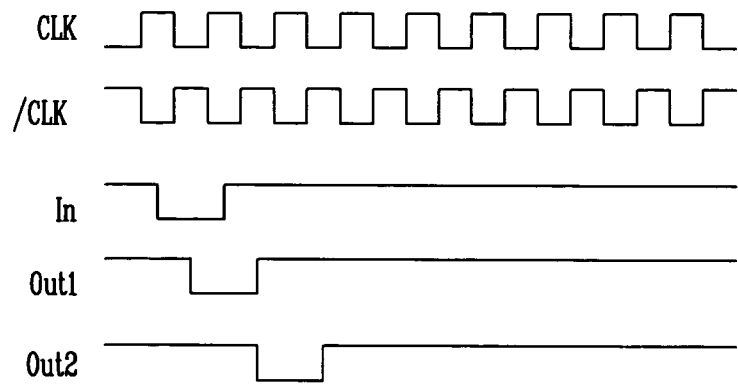
FIG. 3 is an input/output waveform diagram of the stage shown in FIG. 2.

Hereinafter, certain inventive aspects will be described with reference to the accompanying drawings. Here, when a first element is connected to a second element, the first element may be directly connected to the second element or may be indirectly connected to the second element via a third element. Further, irrelative elements are omitted for clarity. Also, like reference numerals refer to like elements throughout.

Figure 4:
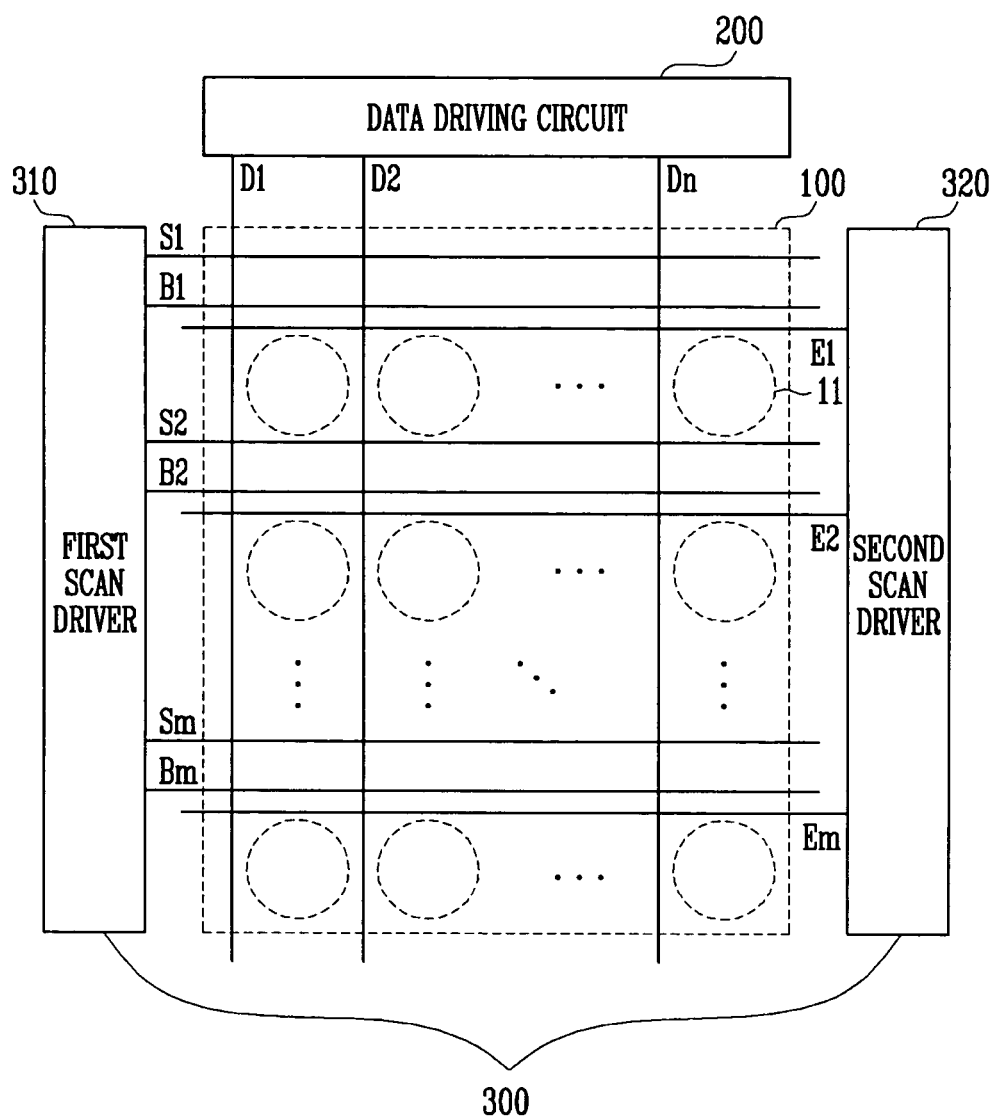
FIG. 4 is a block diagram showing an organic light emitting display according to one embodiment.

FIG. 4 is a block view showing an organic light emitting display according to one embodiment;

As shown in FIG. 4, the organic light emitting display according to one embodiment includes an organic light emitting display panel (referred to as 'display panel' hereinafter) 100, a data driving circuit 200, and a scan driving circuit. The scan driving circuit includes a first scan driver 310 and a second scan driver 320. The first scan driver 310 provides a selection signal and/or a boost signal. The second scan driver 320 provides an emission signal.

The first scan driver 310 may be configured to be divided into a scan drive unit and a boost drive unit for outputting the selection signal and the boost signal, respectively. In this case, the boost drive unit can be further divided into odd- and even-numbered boost signals.

The display panel 100 includes a plurality of data lines D1 through Dn, a plurality of signal lines S1 to Sm, E1 to Em, B1 to Bm, and a plurality of pixel circuits 11. The plurality of data lines D1 through Dn are arranged in a column direction. The plurality of signal lines S1 to Sm and E1 to Em are arranged in a row direction. The plurality of pixel circuits 11 are arranged in an array.

Here, the signal lines S1 to Sm and E1 to Em include a plurality of selection signal lines S1 to Sm for transferring a selection signal to select a pixel row, a plurality of emission signal lines E1 to Em for transferring an emission signal to control an emission period of a pixel row, and a plurality of boost signal lines B1 to Bm for transferring a boost signal to set a gate voltage of the drive thin film transistors in a pixel row.

Further, pixel circuits 11 are formed at a pixel region defined by the data lines D1 through Dn, the selection signal lines S1 to Sm, the emission signal lines E1 to Em, and boost signal lines B1 to Bm.

The data driving circuit 200 applies a data current $I_{DATA}$ to the data lines D1 through Dn. The first scan driver 310 of the scan driving circuit 300 sequentially applies a selecting signal for selecting a pixel circuit 11 to the selection signal lines S1 to Sm. Further, the data driving circuit 200 sequentially applies a boost signal to the boost signal lines B1 to Bm to set a gate voltage of the drive thin film transistors of each pixel row.

Further, the second scan driver 320 of the scan driving circuit 300 applies an emission signal for controlling a luminance of the pixel circuit 11 to the emission signal lines E1 to Em.

Figure 5:
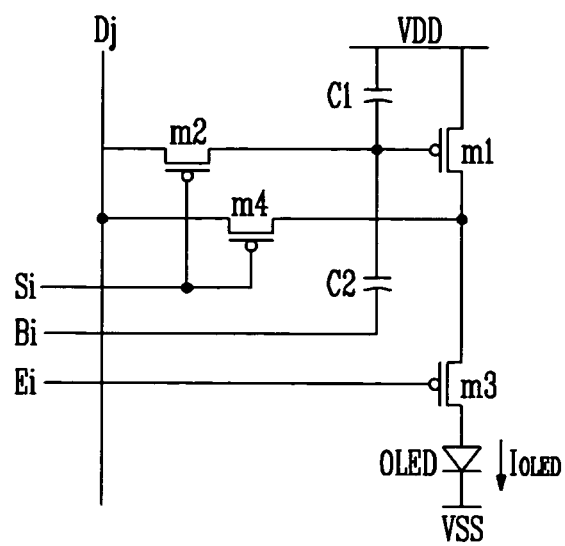
FIG. 5 is a circuit diagram showing an example of a pixel circuit arranged at each pixel region of the organic light emitting display shown in FIG. 4.

FIG. 5 is a circuit diagram showing an example of a pixel circuit arranged shown in FIG. 4. However, in order to help understanding of the pixel circuit, only a pixel circuit connected to a j-th data line Dj and i-th signal lines Si and Ei is shown in FIG. 5.

As shown in FIG. 5, the pixel circuit according to one embodiment includes an organic light emitting diode OLED, transistors m1 to m4, and first and second capacitors C1 and C2. Here, although PMOS transistors are used for each of the transistors m1 to m4, NMOS and CMOS implementations are also possible.

A first transistor m1 is coupled between a power supply VDD and an organic light emitting diode OLED, and controls an electric current through the organic light emitting diode OLED. In detail, a source of the first transistor m1 is coupled with the power supply VDD, and a drain thereof is coupled with a cathode of the organic light emitting diode OLED through a third transistor m3.

Furthermore, in response to a selection signal from the selection signal line Si, the second transistor m2 passes a voltage from the data line Dj to a gate of the first transistor m1. A fourth transistor m4 diode-connects the first transistor m1 in response to the selection signal.

Moreover, the first capacitor C1 is coupled between a gate and a source of the first transistor m1, and is charged with a voltage corresponding to the gate voltage of the first transistor m1 when sourcing the data current $I_{DATA}$ to the data line Dj. A third transistor m3 passes an electric current flowing through the first transistor m1 to the organic light emitting diode OLED in response to an emission signal from the emission signal line Ei.

Further, the second capacitor C2 is coupled between the gate of the first transistor m1 and the boost signal line Bj.

Here, a voltage of the second capacitor C2 is increased by a voltage increase magnitude $\Delta V_B$ of a boost signal on the boost signal line Bj, and thus an increase magnitude $\Delta V_G$ of a gate voltage $V_G$ of the first transistor m1 is generated. $V_G$ may be approximated by the following equation 1.

$$\Delta V_G = \frac{\Delta V_B C_2}{C_1 + C_2} \quad (1)$$

As indicated by equation 1, by increasing the voltage of the boost signal by $\Delta V_B$, the gate voltage $V_G$ is increased by $\Delta V_G$ according to the capacitances of the first and second capacitors. Parasitic capacitances of the transistors m1, m2, and m4, and the interconnects will also affect $\Delta V_G$. The parasitic capacitances decrease $\Delta V_G$ by an amount related to the amount of parasitic capacitance relative to the sum of the first and second capacitors. Accordingly, the current $I_{OLED}$ supplied to an organic light emitting diode OLED can be set at the desired value.

Figure 6:
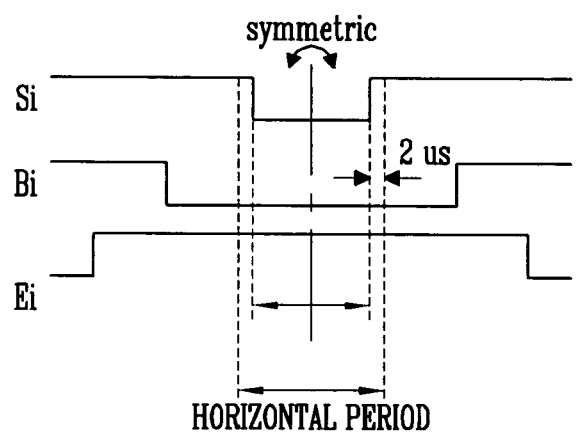
FIG. 6 is a waveform diagram of selection, emission, and boost signals that are supplied to the pixel circuit shown in FIG. 5.

FIG. 6 is a timing diagram of selection, emission, and boost signals that are supplied to the pixel circuit shown in FIG. 5.

Referring to FIG. 5 and FIG. 6, while the first, second, and fourth transistors m1, m2, and m4 are turned-on and the data current $I_{DATA}$ is being sourced by the first transistor m1, the third transistor m3 is turned-off. While in this state, the first transistor is effectively diode connected by the second and fourth transistors m2 and m4. Accordingly, the gate voltage of the first transistor m1, goes to a value corresponding to the data current $I_{DATA}$, and is stored in the capacitor C1.

As shown in FIG. 6, by generating a pulse end of an emission signal of an emission signal line Ei so as to be generated after a pulse end of selection signal line Si, the third transistor m3 is not turned on while the second transistor m2 is on.

That is, in the embodiment of FIGS. 5 and 6, the selection signal is applied in such a manner that a pulse of a low level of the selection signal ends before horizontal period by approximately 2 μs. Also shown in FIG. 6, the emission signal is applied in such a way that the pulse width of a high level of the emission signal spans the pulse width of the low level of the selection signal.

Moreover, when the pulse end of a boost signal from the boost signal line Bi is generated after the pulse end of the selection signal, when a node voltage of the second capacitor C2 is increased, programming of the data current $I_{DATA}$ is complete, and thus the effect of increasing a node voltage of the second capacitor C2 is removed. Therefore, in this embodiment, as shown in FIG. 6, by controlling a pulse end of a selection signal transferred to the selection signal line Sn to be generated before the pulse end of a boost signal transferred to the boost signal line Bn, a node voltage of the second capacitor C2 is increased after a programming of the data current $I_{DATA}$.

Furthermore, by controlling a pulse start of the boost signal so as to be generated before a pulse start of the selection signal, while a voltage is programming in the first capacitor C1, a voltage of the first capacitor C1 varies due to a drop of a node voltage of the second capacitor C2. As noted previously, when the voltage of the first capacitor C1 changes, a voltage programming operation of the first capacitor C1 should be again performed, and thus a time of programming a voltage in the first capacitor C1 is needed. Accordingly, as shown in FIG. 6, by controlling a start of the selection signal transferred to the selection signal line Sn to be generated after a start of the boost signal transferred to the boost signal line Bn, a programming operation of the data current $I_{DATA}$ is performed after a node voltage of the second capacitor C2 drops.

Due to a difference between a load connected to the boost signal line Bn and a load connected to the emission signal line En, a pulse end of the emission signal is generated prior to a pulse end of the boost signal, during a time period between the pulse end of the emission signal and the pulse end of the boost signal, an electric current before an increase in a node voltage of the second capacitor C2 flows through an organic light emitting diode OLED, thereby occurring stress in the organic light emitting diode OLED. When such an operation repeats, the lifetime of the organic light emitting diode OLED may be shortened. Consequently, as shown in FIG. 6, by generating a pulse end of the boost signal transferred to the boost signal line Bn before a pulse end of the emission signal transferred to the emission signal line En, an electric current flows through the organic light emitting diode OLED after a node voltage of the second capacitor C2 has been increased.

Furthermore, if a pulse start of the emission signal is generated after a pulse start of the boost signal, during a time period between the pulse start of the emission signal and the pulse start of the boost signal, an electric current due to a drop in a node voltage of the second capacitor C2 flows through an organic light emitting diode OLED, thereby resulting in stress in the organic light emitting diode OLED. When such an operation repeats, the lifetime of the organic light emitting diode OLED may be shortened. Consequently, as shown in FIG. 6, by generating the pulse start of the emission signal ahead of the pulse start of the boost signal, a node voltage of the second capacitor C2 drops after the third transistor m3 has been turned-off.

That is, in this embodiment, the boost signal is applied in such a manner that a pulse width of a low level of the boost signal spans a pulse width of a low level of the selection signal and is less than that of a high level of the emission signal.

As seen from FIG. 4, the selection signal, the boost signal, and the emission signal are output through a first scan driver 310 and a second scan driver 320, which are provided to a panel.

A construction and an operation of a scan driving circuit of one embodiment for outputting selection and boost signals having waveforms as shown in FIG. 6 will now be given.

That is, only the first scan driver of the scan driving circuit will be described. Since a description of the second scan driver can be easily obtained from the description of the first scan driver, no further detailed description will be provided.

Figure 7:
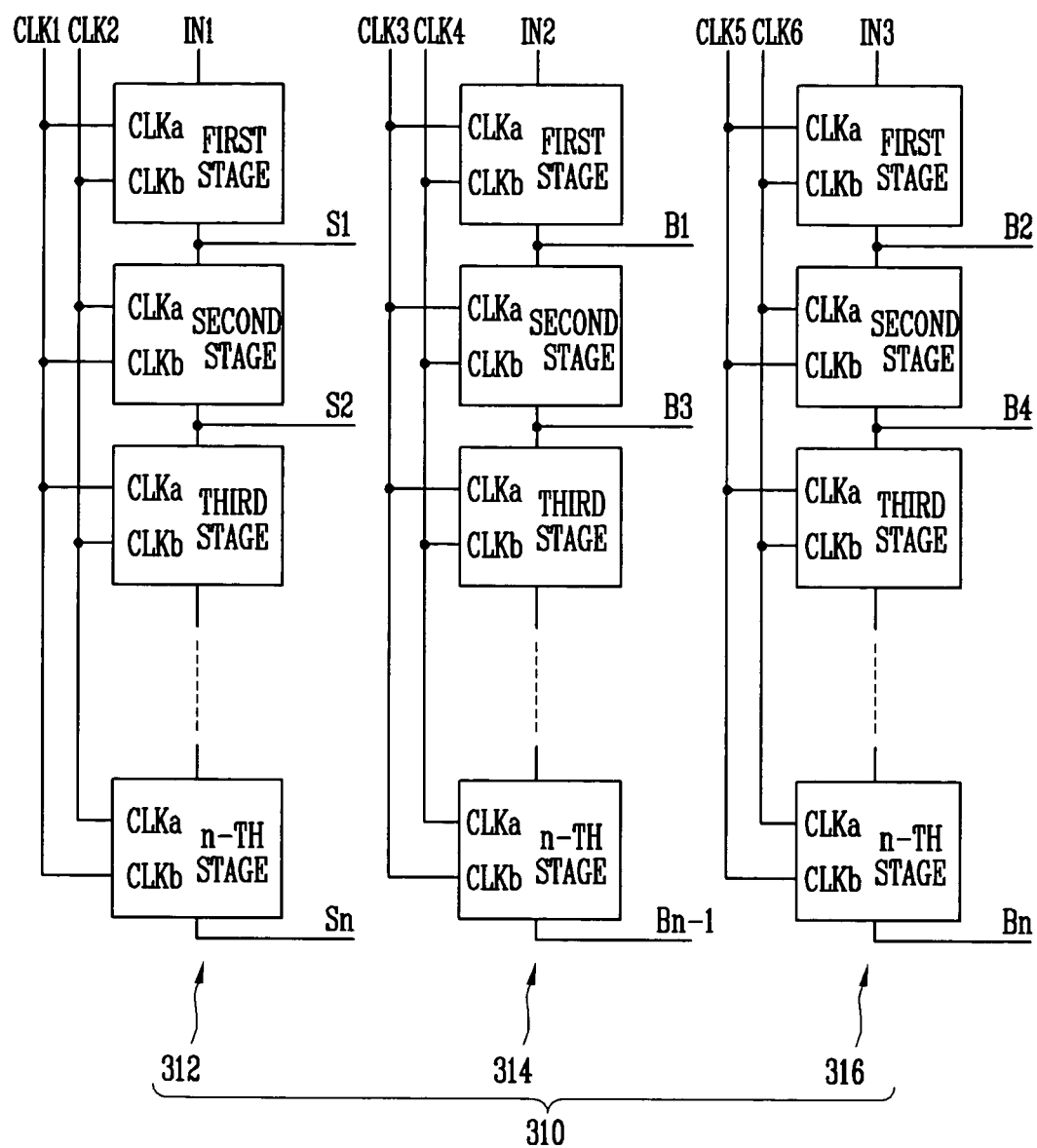
FIG. 7 is a block diagram showing a configuration of a first scan driver of a scan driving circuit according to an embodiment.

FIG. 7 is a block diagram showing a configuration of a first scan driver of a scan driving circuit according to one embodiment.

Here, the first scan driver 310 according to one embodiment is divided into a scan drive unit 312 and boost drive units 314 and 316, so that the scan drive unit 312 and the boost drive units 314 and 316 output a selection signal and a boost signal, respectively. Further, the boost drive unit includes a first boost drive unit 314 and a second boost drive unit 316 for separately outputting odd- and even-numbered boost signals.

The scan drive unit 312, the first and second boost drive units 314 and 316 include n stages that are dependently coupled with input signal IN1, IN2, IN3 lines thereof, respectively.

First output lines of the first n stages of the scan drive unit 312 are coupled with first n row lines S1 to Sn included in the pixel array, and provide a selection signal to respective pixels defining the pixel array. Second output lines of the second n stages of the boost drive units 314 and 316 are coupled with second n row lines B1 to Bn included in the pixel array, and provide a boost signal to respective pixels defining the pixel array.

Here, a first input signal IN1 is supplied to a first stage included in the scan drive unit 312, a first input signal IN2 is supplied to a first stage included in the first boost drive unit 314, and a first input signal IN3 is supplied to a first stage included in the second boost drive unit 316. Output signals of first to (n−1)th stages are supplied to respective next stages as input signals.

Further, each stage of the scan drive unit 312 includes a first clock terminal CLKa and a second clock terminal CLKb. First and second phase inverted clock signals CLK1 and CLK2 in which parts of high levels overlap with each other, are supplied to the first clock terminal CLKa and the second clock terminal CLKb, respectively. A first clock signal CLK1 is supplied to the first clock terminal CLKa of odd-numbered stages in the first scan driver 310, and a second clock signal CLK2 is supplied to the second clock terminal CLKb. In contrast to this, the second clock signal CLK2 is supplied to a first clock terminal CLKa of even-numbered stages, and the first clock signal CLK1 is supplied to a second clock terminal CLKb of the even-numbered stages.

That is, when each stage receives the first input signal IN1 or an output voltage gi of a previous stage, and the first and second clock signals CLK1 and CLK2, it sequentially outputs a low-level signal through an output lines thereof at time intervals as the first and second clock signals overlap with each other at high level.

In the same manner as above, respective stages of the first boost drive unit 314 and the second boost drive unit 316 include first and second clock terminals CLKa and CLKb. Third and fourth clock signals CLK3 and CLK4 whose phases are inverted and in which parts of high level overlap with each other, and fifth and sixth clock signals CLK5 and CLK6, are provided to the first and second clock terminals CLKa and CLKb.

Here, as shown, a third clock signal CLK3 or a fifth clock signal CLK5 is supplied to the first clock terminal CLKa of odd-numbered stages, and a fourth clock signal CLK4 or a sixth clock signal CLK6 is supplied to the second clock terminal CLKb thereof.

In contrast to this, the fourth clock signal CLK4 or the sixth clock signal CLK6 is supplied to a first clock terminal CLKa of even-numbered stages, and the third clock signal CLK3 or the fifth clock signal CLK5 is supplied to a second clock terminal CLKb of the even-numbered stages.

That is, when each stage receives the first input signal IN2 or IN3, or an output voltage gi of a previous stage, and the third and fourth clock signals CLK3 and CLK4, or the fifth and sixth clock signals CLK4 and CLK6, it sequentially outputs a low-level signal to respective odd- and even-numbered boost signal lines through an output line thereof at time intervals in which the third and fourth clock signals CLK3 and CLK4, or the fifth and sixth clock signals CLK4 and CLK6 overlap with each other at high level.

As seen from FIG. 6, the boost signal is output in such a manner that a pulse width of a low level of the boost signal spans a pulse width of a low level of the selection signal and is less than that of a high level of the emission signal. Further, the selection having a pulse width of a low level less than that of a horizontal period is output.

Namely, in this embodiment, in order to set a pulse width of the boost signal greater than that of the horizontal period, the boost drive unit is configured to be divided into an odd-numbered output unit 314 and an even-numbered output unit 316.

Figure 8:
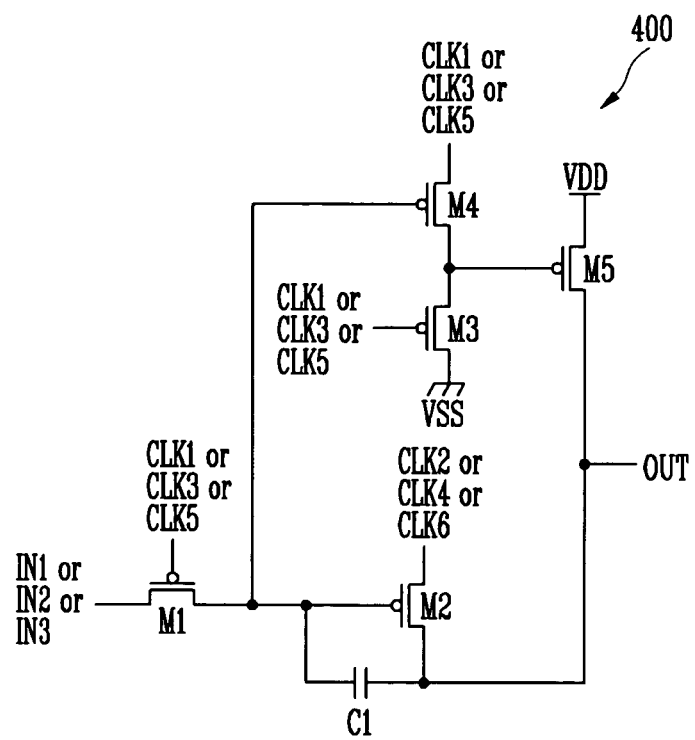
FIG. 8 is a circuit diagram of a stage in a first scan driver of the scan driving circuit according to a first embodiment.
Figure 9:
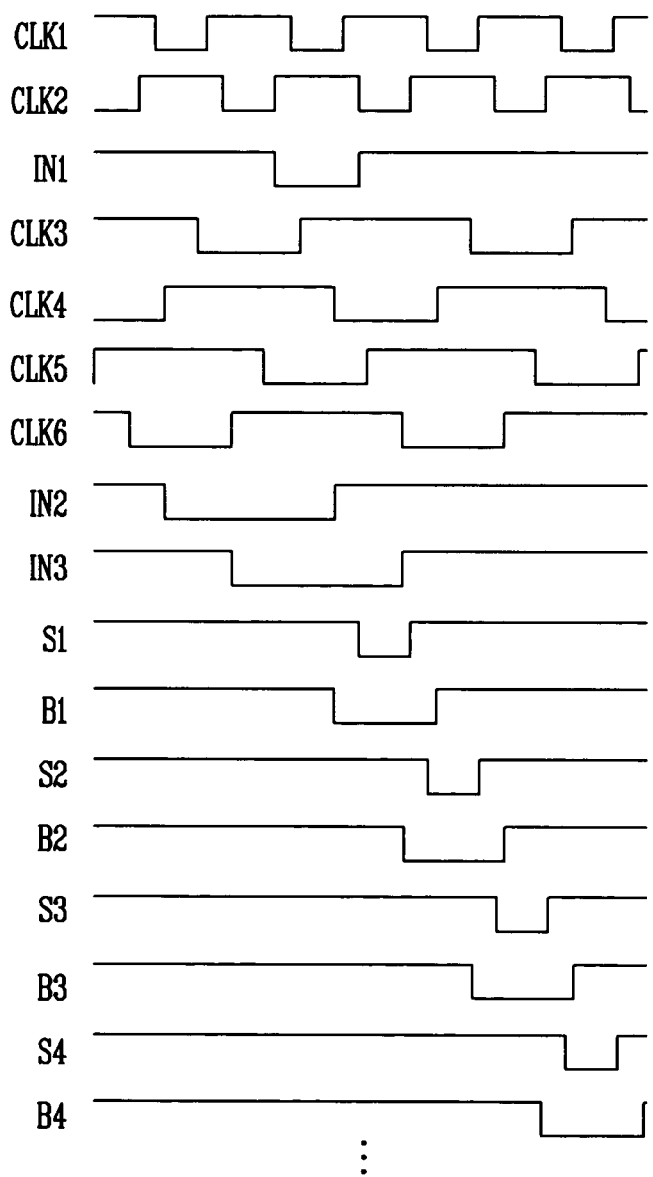
FIG. 9 is an input/output waveform diagram of the stage shown in FIG. 8.

FIG. 8 is a circuit diagram of an embodiment of a stage in the scan driving circuit shown in FIG. 7, which shows a detailed circuit arrangement of odd-numbered stages of the scan drive unit, first and second boost drive units. FIG. 9 is an input/output waveform diagram of the stage shown in FIG. 8.

With reference to FIG. 8 and FIG. 9, each odd-numbered stage of the scan drive unit, first and second boost drive units is precharged to first and second input clock signals CLK1 and CLK2, CLK3 and CLK4, or CLK5 and CLK6 during the first time period having phases inverted to each other. The odd-numbered stage performs an evaluation operation during a second period having a phase inverted to a phase of the first period to sequentially output a low-level pulse at overlapped time intervals of the clock signal at a high level.

Namely, the odd-numbered stage outputs a high-level signal during a precharge period, and outputs a signal corresponding to an input received during the precharge period during an evaluation period.

Moreover, the evaluation period of the odd-numbered stages is designated to coincide with the precharge period of even-numbered stages, Hereinafter, operation of stages will be explained in detail by reference to a circuit arrangement of an odd-numbered stage shown in FIG. 8.

PMOS thin film transistors will be now described as an example of transistors included in the stages. However, other implementations are also possible, such as NMOS or CMOS embodiments.

Referring to FIG. 8, an odd-numbered stage 400 according to one embodiment includes a first PMOS transistor M1, a second PMOS transistor M2, a third PMOS transistor M3, a fourth PMOS transistor M4, and a fifth PMOS transistor M5. The first PMOS transistor M1 receives an output voltage gi of a previous stage or a first input signal N1 or N2. A gate terminal of the first PMOS transistor M1 is coupled with a first clock terminal. The second PMOS transistor M2 is coupled with a second clock terminal and an output line OUT, and a gate terminal thereof is coupled with an output terminal of the first PMOS transistor M1. The third PMOS transistor M3 is coupled between a second power supply VSS and a first node N1, a gate terminal thereof is coupled with the first clock terminal. The fourth PMOS transistor M4 is coupled between the first clock terminal and the first node N1, and a gate terminal thereof is coupled with an output terminal of the first PMOS transistor M1. The fifth PMOS transistor M5 is coupled between a first power supply VDD and the output line OUT, and a gate terminal thereof is coupled with the first node N1.

The scan driving circuit further includes a first capacitor C1 that is coupled between an output terminal of the first PMOS transistor M1 and the output line OUT.

As shown, when the stage is an odd-numbered stage of the scan drive unit, a first clock signal CLK1 is supplied to the first clock terminal, and a second clock signal CLK2 is supplied to the second clock terminal. On the contrary, when the stage is an even-numbered stage 322 of the scan drive unit, the second clock signal CLK2 is supplied to the first clock terminal, and the first clock signal CLK1 is supplied to the second clock terminal.

In contrast to this, as shown, when the stage is an odd-numbered stage of the first boost drive unit 314, a third clock signal CLK3 is supplied to the first clock terminal, and a fourth clock signal CLK4 is supplied to the second clock terminal. On the contrary, when the stage is an even-numbered stage of the first boost drive unit, the fourth clock signal CLK4 is supplied to the first clock terminal, and the third clock signal CLK3 is supplied to the second clock terminal.

Further, as shown, when the stage is an odd-numbered stage of the second boost drive unit 316, a fifth clock signal CLK5 is supplied to the first clock terminal, and a sixth clock signal CLK6 is supplied to the second clock terminal. On the contrary, when the stage is an even-numbered stage of the second boost drive unit 316, the sixth clock signal CLK6 is supplied to the first clock terminal, and the fifth clock signal CLK5 is supplied to the second clock terminal.

Furthermore, a negative supply voltage may be applied to the second power supply VSS, but the second power supply VSS may be grounded as shown in FIG. 8. In one embodiment, it is shown that the second power supply VSS is embodied to be grounded.

Each stage includes a transfer unit, an inversion unit, and a buffer unit. The transfer unit is composed of first PMOS transistor M1, second PMOS transistor M2, and first capacitor C1. The inversion unit is composed of first, third, and fourth PMOS transistors M1, M3, and M4. The buffer unit is composed of a fifth PMOS transistor M5.

Assuming that the stage is an odd-numbered stage 312 of the first scan driver, a time period when the first clock signal CLK1 has a low level but the second clock signal CLK2 has a high level becomes a precharge period. A time period when the first clock signal CLK1 has a high level but the second clock signal CLK2 has a low level becomes an evaluation period. The odd-numbered stage 312 of the first scan driver outputs a high-level signal during the precharge period, and outputs a signal corresponding to an input received during the precharge during the evaluation period.

In this embodiment, as shown, first and second clock signals, third and fourth clock signals, or fifth and sixth clock signals as input signals of each stage are each provided so as to overlap each other at a part of a high level.

Each stage outputs a pair of clock signals CLK1 and CLK2, CLK3 and CLK4, or CLK5 and CLK6 so as to have time intervals corresponding to an overlapped time of the first and second clock signals CLK1 and CLK2 at a high level. The reason to have predetermined time intervals between output signals of each stage is for guaranteeing a margin for a clock skew or delay.

An operation of the odd-numbered stage will be explained with reference to FIG. 8 and FIG. 9. First, during the precharge period, namely, while the first clock signal CLK1 of a low level and a second clock signal CLK2 of a high level are inputting thereto, the first and third transistors M1 and M3 are turned-on, whereby an input signal IN1 is transferred to gate terminals of the second and fourth transistors M2 and M4.

Accordingly, since an output voltage of a previous stage or an input signal IN1 is stored in the first capacitor C1 as an input signal, and a first node N1 is charged with a second clock signal CLK2 or a low-level signal from the second power supply VSS, the fifth transistor M5 is turned-on, with the result that a first power supply VDD of a high level is output through an output terminal OUT.

That is, during the precharge period, an output of the buffer unit of the stage becomes a high level. Moreover, during the evaluation period, the first transistor M1 is turned-off, thereby blocking an input signal IN1 and the third and fourth transistors M3 and M4 are accordingly turned-off.

When a signal received during the precharge period, namely, an output voltage of a previous stage or an input signal IN1 is at a high level, the received signal maintains a level of a signal precharged during the precharge period, whereby the buffer unit outputs a high-level signal unchanged.

In contrast to this, when the signal received during the precharge period, namely, an output voltage of a previous stage or an input signal IN1 is at a low level, the second transistor M2 is turned-on according to the low-level signal stored in the first capacitor C1. Accordingly, in the transfer unit, as the second transistor M2 is turned-on, a second clock signal CLK2 of a low level is output through an output terminal OUT.

That is, during the evaluation period, when a signal received during the precharge period, namely, an output voltage of a previous stage or an input signal IN1 is at a low level, the stage outputs a low-level signal. When the received signal is at a high level, the stage outputs a high-level signal.

As noted previously, first and second clock signals as input signals of each stage are provided to overlap each other at a part of a high level as shown in FIG. 9.

In a case that the first and second clock signals CLK1 and CLK2 are at high level, when a previous period is a precharge period, first and third transistors M1 and M3 controlled by the first clock signal CLK1 are all turned-off, and a voltage of a capacitor C1 remains unchanged, thereby maintaining a previous output.

In contrast to this, when the previous period is an evaluation period, the first and third transistors M1 and M3 are turned-off, a second transistor M2 maintains a previous state. When the second transistor M2 is turned-off, the stage receives a high-level signal, with the result that a high-level output is remained by a fifth transistor M5.

On the contrary, when the evaluation transistor M3 is turned-on, since the stage receives a low-level signal, namely, a gate terminal of the second transistor M2 is in a floating state, a voltage of the capacitor C1 remains unchanged, and thus the second transistor M2 continues to be turned-on that causes a second clock signal of high level to be output as an output signal.

As is seen from the foregoing description, in a case that the first and second clock signals CLK1 and CLK2 are at high level, when a previous period is a precharge period, an output maintains a previous state. When the previous period is an evaluation period, an output has a high level. Consequently, a time interval may be reduced between output pulses of adjacent stages by an overlapped time in high levels of the first and second clock signals CLK1 and CLK2.

Although, described above were results on the odd-numbered state of the first scan driver, the same results were obtained on an odd-numbered stage of the first boost drive unit or the second boost drive unit Accordingly, when the first boost drive unit 314 and the second boost drive unit 316 of FIG. 7 receive third and fourth clock signals CLK3 and CLK4, and an input signal IN2; and fifth and sixth clock signals CLK5 and CLK6, and an input signal IN3, respective, they sequentially output a low-level pulse at overlapped time intervals of a pair of clock signals CLK3 and CLK4 or CLK5 and CLK6 at a high level.

As shown in FIG. 9, third and fourth clock signals CLK3 and CLK4, or fifth and sixth clock signals CLK5 and CLK6 are input to have longer overlapped time, precharge period, and evaluation period as compared with first and second clock signals CLK1 and CLK2. Further, input signals IN1 and IN3 respectively input to the first and second boost drive units have low level of greater width in comparison with that of an input signal IN1 input to the scan drive unit.

In addition, the fifth and sixth clock signals CLK5 and CLK 6, and an input signal IN2 are input to a stage of the second boost drive unit 316 to be delayed by approximately one horizontal period in comparison with the third and fourth clock signals CLK3 and CLK4 and the input signal IN3 input to a stage of the first boost drive unit 314.

As seen from FIG. 6, this operation is performed to cause the boost signal to be greatly applied in such a way that a pulse width of a high level of the boost signal contains the pulse width of a low level of a corresponding selection signal.

That is, in one embodiment, in order to make the output boost signal to have a pulse width greater than that of a corresponding selection signal, the boost drive unit is configured to be divided into an odd-numbered output unit and an even-numbered output unit. Time periods of clock signals CLK3, CLK4, CLK5, and CLK6 applied to respective boost drive units and low-level widths of the input signals IN1 and IN2 are adjusted.

Figure 10:
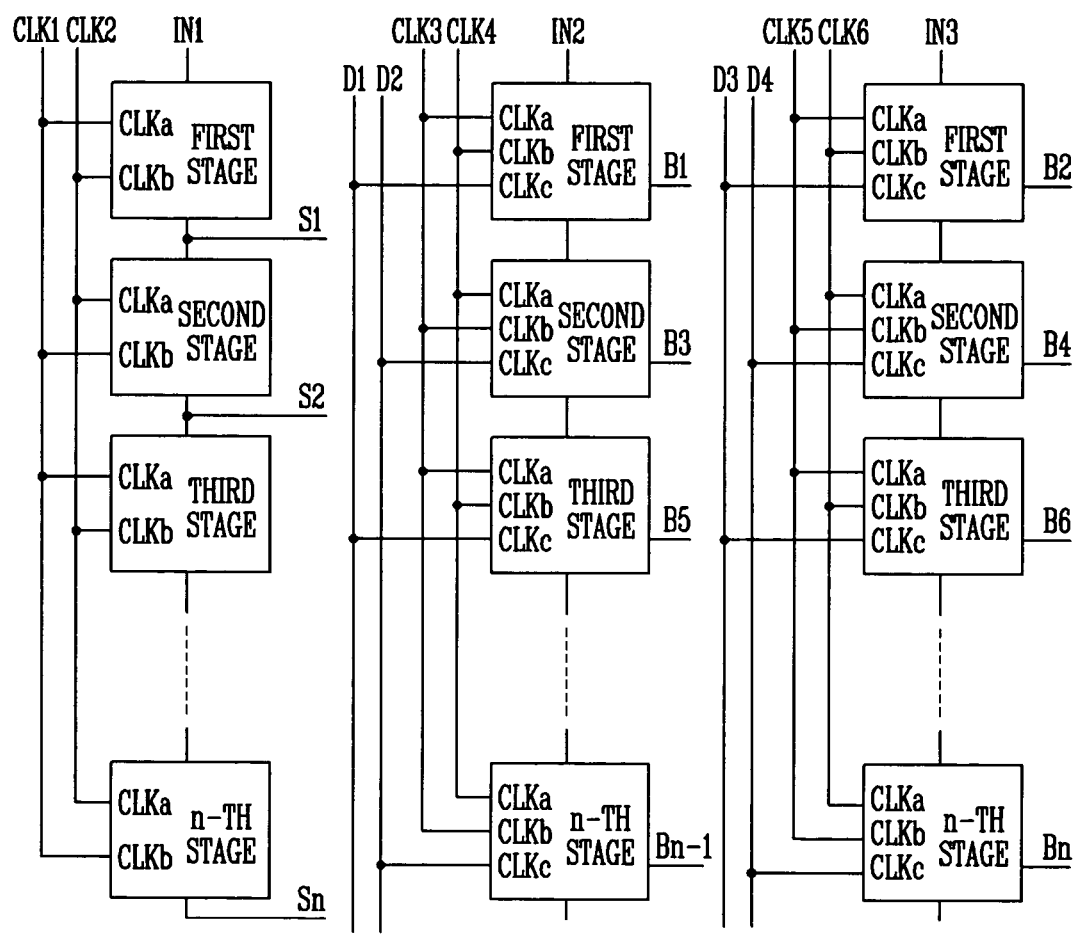
FIG. 10 is a block diagram showing a configuration of a first scan driver of a scan driving circuit according to an embodiment.

FIG. 10 is a block diagram showing a configuration of a first scan driver of a scan driving circuit according to another embodiment.

However, a description of the same construction and operation of the second embodiment as those of the first embodiment shown in FIG. 7 is omitted.

In the same manner as in the first embodiment shown in FIG. 7, a first scan drive of the first embodiment is configured to be divided into a scan drive unit and a boost drive unit for outputting a selection signal and a boost signal, respectively. In particular, the boost drive unit is composed of a first boost drive unit and a second boost drive unit for separating outputting an odd-numbered boost signal and an even-numbered boost signal.

However, besides clock signals CLK3, CLK4, CLK5, and CLK6, and input signals IN2 and IN3, control signals D1, D2, D3, and D4 are applied to the first and second boost drive units to adjust a swing of an output pulse.

The first and third control signals D1 and D3 are input to odd-numbered stages of the first and second boost drive units, whereas the second and fourth control signals D2 and D4 are input to even-numbered stage of the first and second boost drive units.

Figure 11:
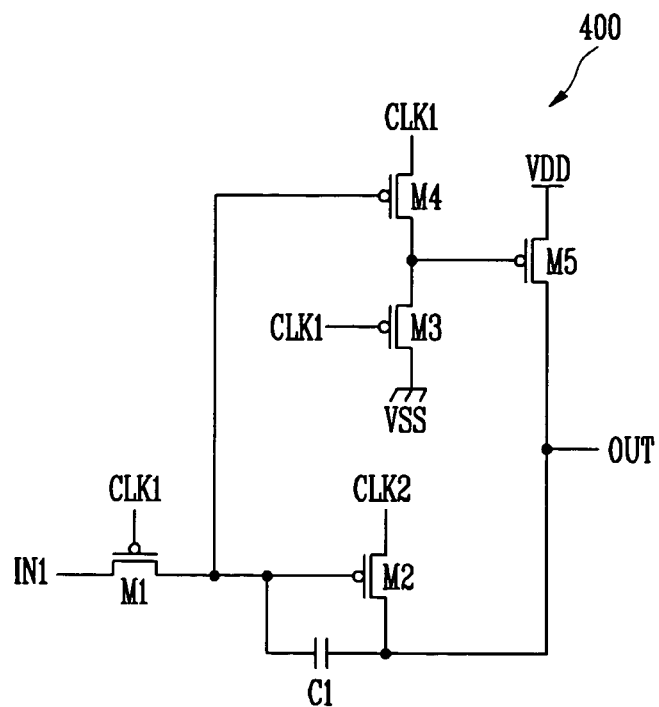
FIG. 11 is a circuit diagram of a stage in a first scan driver of the scan driving circuit according to another embodiment.
Figure 11:
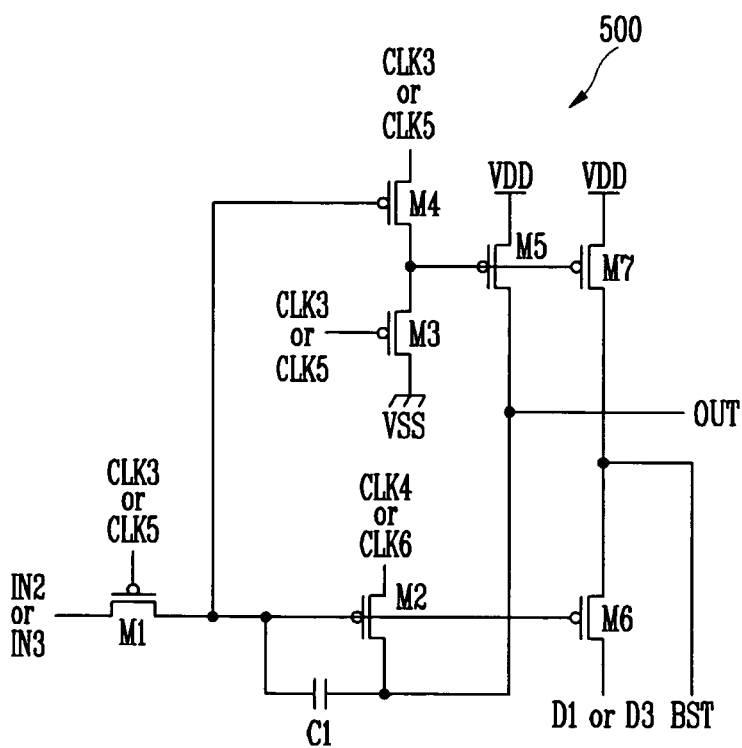
Figure 12:
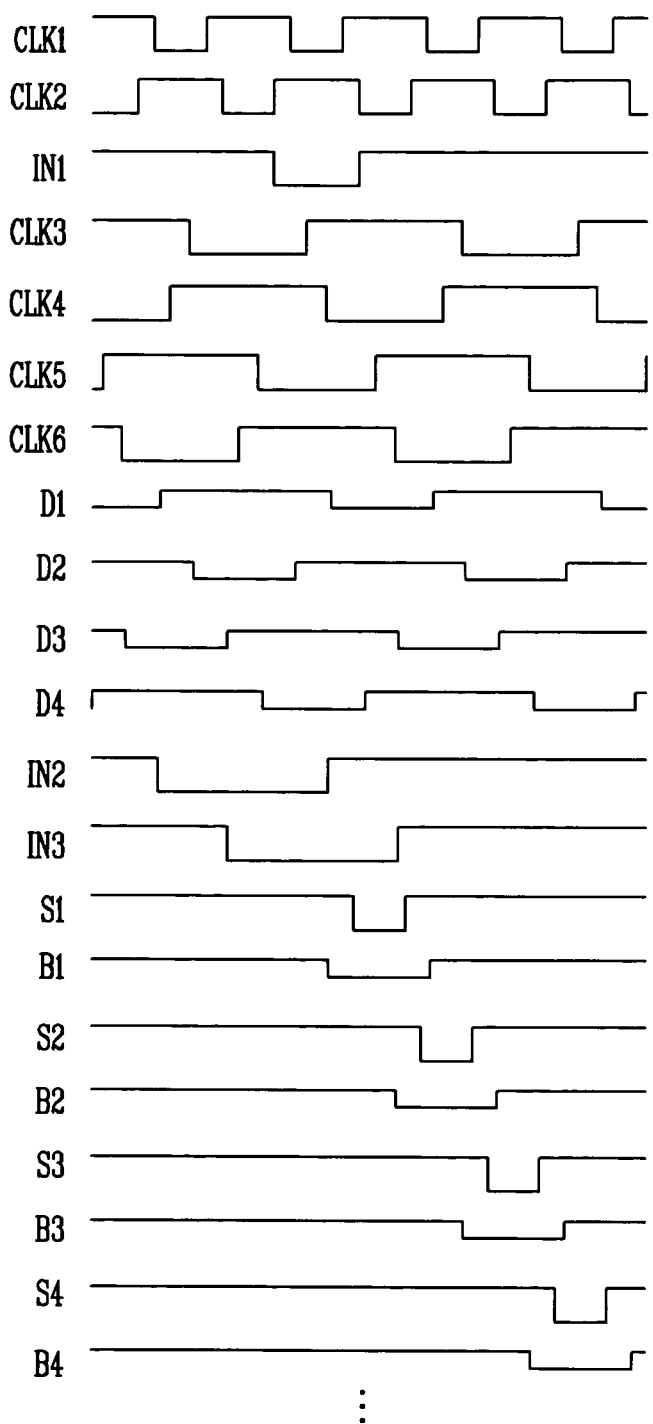
FIG. 12 is an input/output waveform diagram of the stage shown in FIG. 11.

FIG. 11 is a circuit diagram of an embodiment of a stage in a first scan driver of the scan driving circuit, which shows a detailed circuit arrangement of odd-numbered stages of the scan drive unit, first and second boost drive units shown in FIG. 10. FIG. 12 is an put/output waveform diagram of the stage shown in FIG. 11.

A portion of a stage 400 of a scan drive unit shown in FIG. 11, and the timing chart of signals input thereto are identical with those of the first embodiment shown in FIG. 9, and thus a description thereof is omitted.

However, in a case of the first and second boost drive units, a sixth PMOS thin film transistor M6 and a seventh PMOS thin film transistor M7 are further provided in the construction of the first embodiment shown in FIG. 8. Further, the control signals B1, B2, B3, and B4 are input to an input terminal of a sixth transistor M6 in order to adjust a swing of an output boost signal.

Here, first and second control signals D1 and D2 are respectively input to odd- and even-numbered stages of the first boost drive unit, whereas third and fourth control signals D3 and D4 are respectively input to odd- and even-numbered stages of the second boost drive unit.

In a detailed description, as shown in FIG. 11, an odd-numbered stage 500 of a boost drive unit includes first to fifth transistors M1 to M5, a sixth PMOS transistor M6, and a seventh PMOS transistor M7. The sixth PMOS transistor M6 is coupled to a control signal D1 or D3 input line and a boost signal output line BST, and a gate terminal thereof is coupled to an output terminal of the first transistor M1. The seventh PMOS transistor M7 is coupled between a first power supply VDD and the boost signal output line BST.

As noted previously, the sixth and seventh PMOS transistors M6 and M7 are further included. As a control signal is applied through the sixth PMOS transistor M6, a difference between high and low levels in a boost signal output from each stage, namely, a swing of an output pulse is controlled by the control signal.

That is, similar to the first embodiment, the same signal is output through an output terminal of a stage to be input to a next stage. However, a corresponding boost signal is output through a boost signal output line BST of each stage depending on a swing level of the control signal.

As shown in FIG. 12, the first and second control signals D1 and D2 are applied to the first boost drive unit with a less difference of high and low levels as compared with that of the third and fourth clock signals CLK3 and CLK4 applied to the first boost drive unit. That is, the first and second control signals have a swing less than that of the third and fourth corresponding clock signals CLK3 and CLK4.

Similar to that described above, the boost signal is output through a stage of a boost drive unit shown in FIG. 11 as a pulse width greater than that of a corresponding selection signal, and as a pulse having a small difference of high and low levels by the control signal.

That is, this embodiment has an advantage in that it may adjust a pulse swing of an output boost signal.

Figure 13:
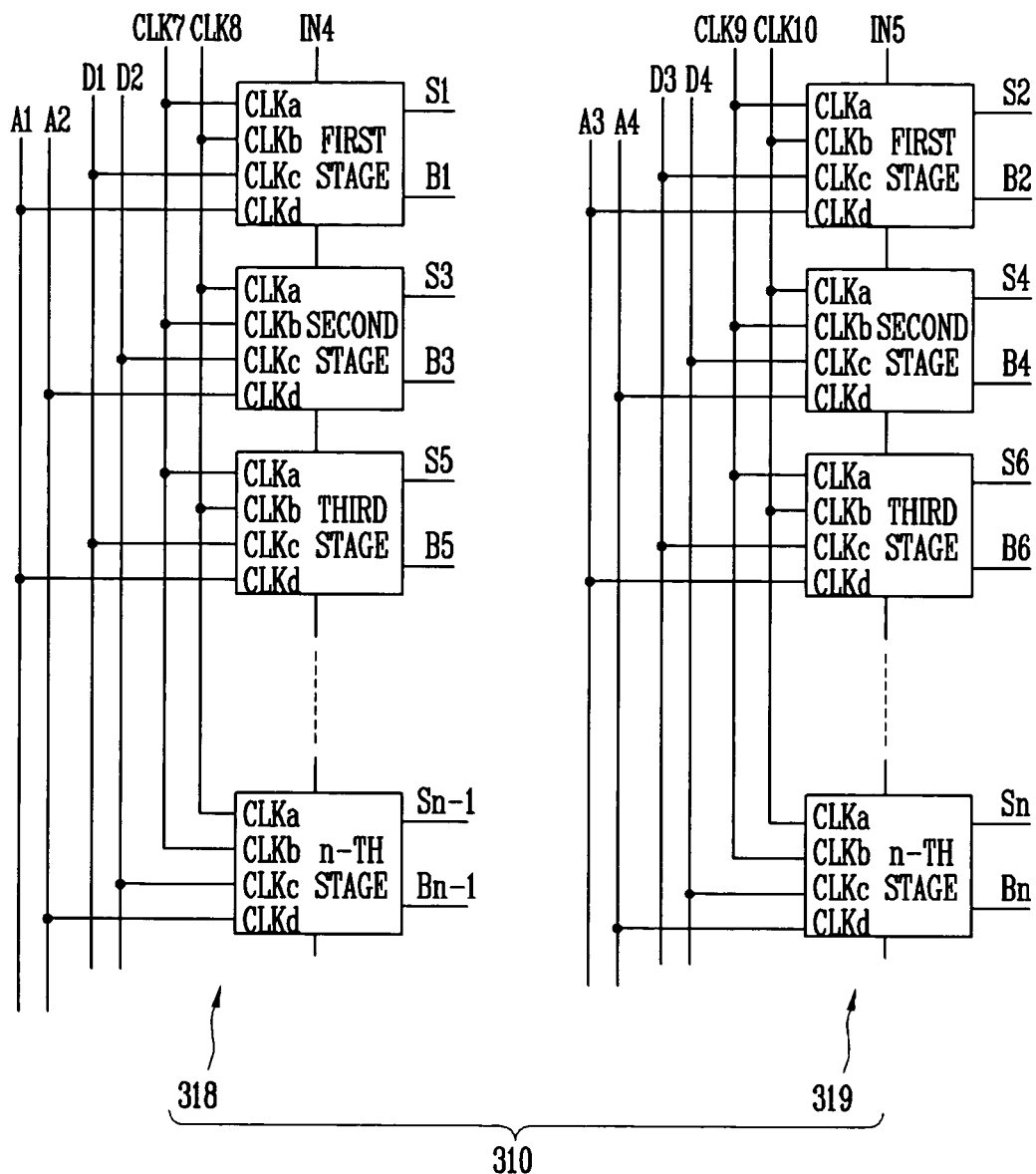
FIG. 13 is a block diagram showing a configuration of a first scan driver of a scan driving circuit according to another embodiment.

FIG. 13 is a block diagram showing a configuration of a first scan driver of a scan driving circuit according to another embodiment.

In the embodiments discussed above, the first scan driver is divided into a scan drive unit, and first and second boost drive units. In other embodiments the scan drive unit is configured to be divided into odd- and even-numbered scan drive units, and the odd- and even-numbered scan drive units are connected to the first and second boost drive units.

In other words, as shown in FIG. 13, the first scan driver 310 includes a first scan/boost drive unit 318 and a second scan/boost drive unit 319. The first scan/boost drive unit 318 outputs odd-numbered selection signal and boost signal. The second scan/boost drive unit 319 outputs even-numbered selection signal and boost signal.

In addition to clock signals CLK7, CLK8, CLK9, CLK10, input signals IN4, IN5, and control signals D1, D2, D3, D4 for adjusting a swing of an output pulse, which have similar function to corresponding signals discussed above, selection control signals A1, A2, A3, and A4 for sequentially outputting odd- and even-numbered selection signals are further applied to the first scan/boost drive unit 318 and the second scan/boost drive unit 319.

First and third selection control signals A1 and A3 are input to odd-numbered stage of the first and second scan/boost drive units 318 and 319, respectively. Second and fourth selection control signals A2 and A4 are input to even-numbered stage of the first and second scan/boost drive units 318 and 319, respectively.

Figure 14:
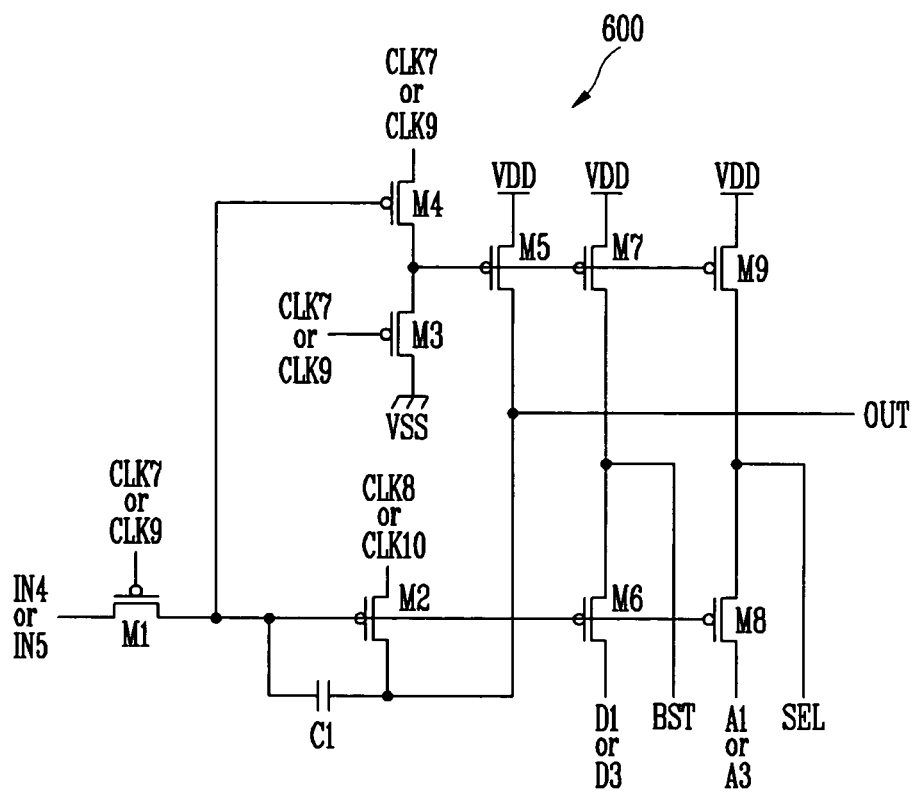
FIG. 14 is a circuit diagram of a stage in a first scan driver of the scan driving circuit according to another embodiment.

FIG. 14 is a circuitry diagram of a stage in a first scan driver of the scan driving circuit, which shows a detailed circuit arrangement of odd-numbered stages of first and second scan/boost drive units 318 and 319 shown in FIG. 13. Further, FIG. 15 is an input/output waveform diagram of the stage shown in FIG. 14.

Figure 15:
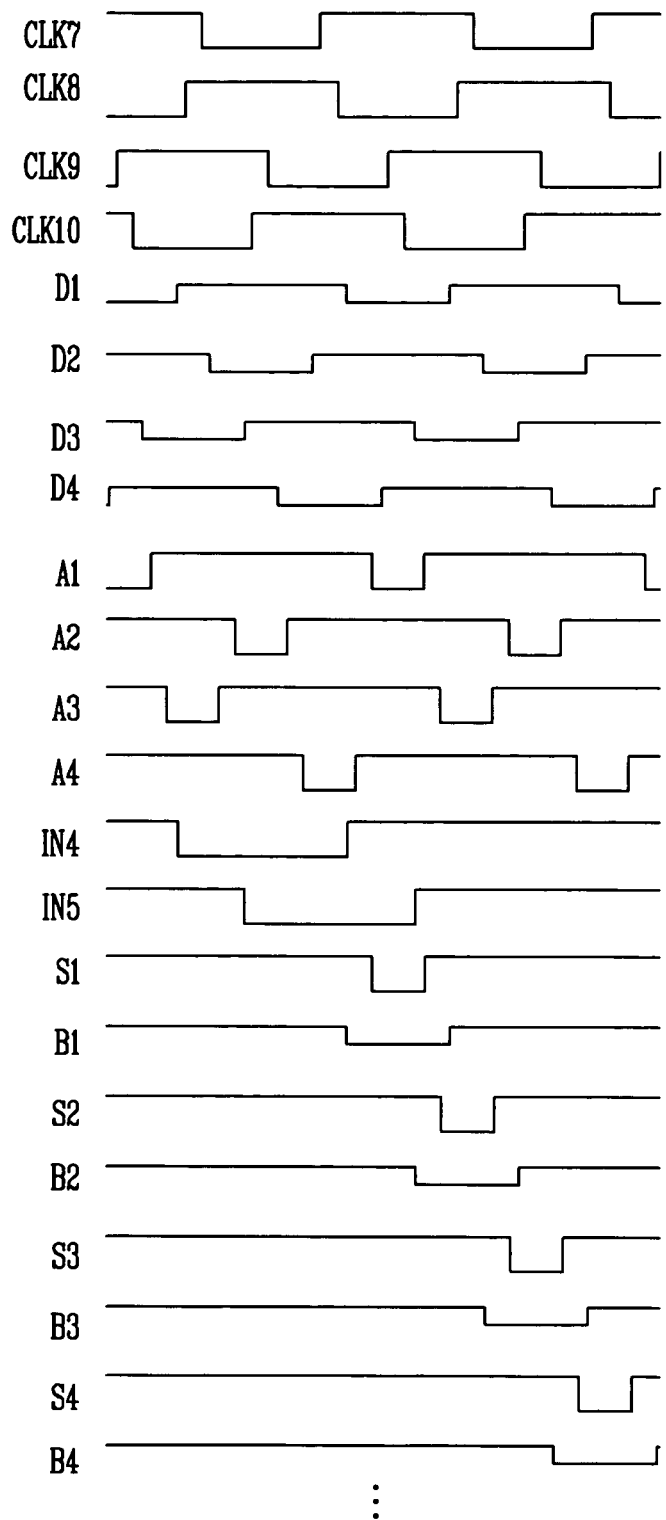
FIG. 15 is an input/output waveform diagram of the stage shown in FIG. 14.

As shown in FIG. 14 and FIG. 15, a scan/boost drive unit is configured by adding an eighth PMOS transistor M8 and a ninth PMOS transistor M9 to an arrangement of the second embodiment shown in FIG. 11. In order to sequentially output odd- and even-numbered selection signals, selection control signals A1, A2, A3, and A4 are input to an input terminal of the eighth PMOS transistor M8.

Herein, first and second selection control signals A1 and A2 are input to odd- and even-numbered stages of the first scan/boost drive unit, respectively. Further, third and fourth selection control signals A3 and A4 are input to odd- and even-numbered stages of the second scan/boost drive unit, respectively.

As shown in FIG. 14, an odd-numbered stage 600 of a scan/boost drive unit further includes first to seventh transistors M1 to M7, a first capacitor C1, an eighth PMOS transistor M8, and a ninth PMOS transistor M9. The eighth PMOS transistor M8 is coupled to a selection control signal A1 or A3 input line and a selection signal output line SEL, and a gate terminal thereof is coupled to an output terminal of the first transistor M1. The ninth PMOS transistor M9 is coupled between a first power supply VDD and the selection signal output line SEL, and a gate terminal thereof is coupled to the first node N1.

As noted previously, the eighth and ninth PMOS transistors M8 and M9 are further included. As a selection control signal is applied through the eighth PMOS transistor M8, as shown in FIG. 15, selection signals output from odd- and even-numbered stages may be output.

That is, this embodiment has advantages in that it may adjust a pulse width and a swing of a boost signal, and may reduce the number of drive units.

Figure 16:
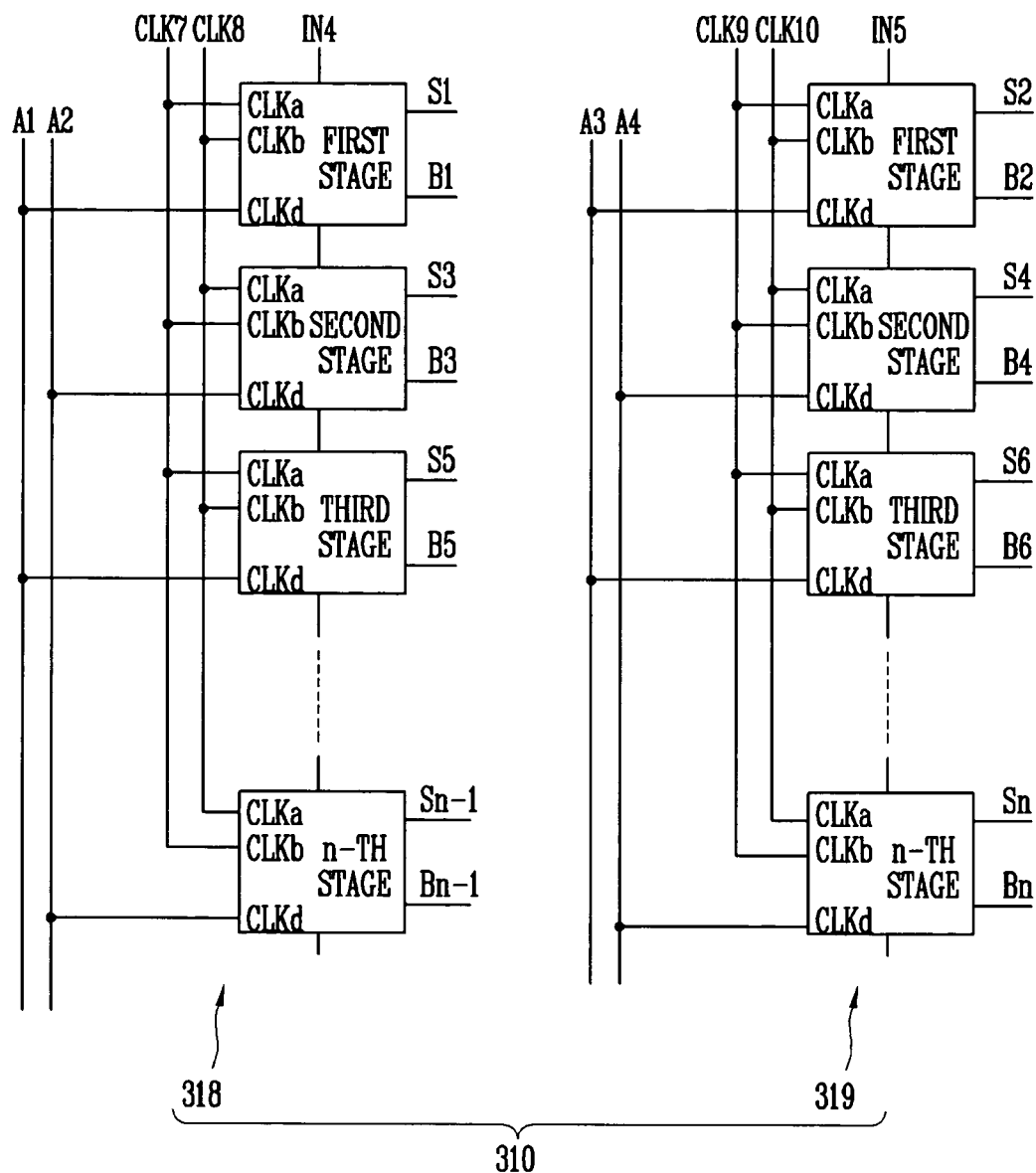
FIG. 16 is a block diagram showing a configuration of a first scan driver of a scan driving circuit according to another embodiment.

FIG. 16 is a block diagram showing a configuration of a first scan driver of a scan driving circuit according to another embodiment.

In this embodiment, it is unnecessary to input control signals D1, D2, D3, and D4 in each stage.

Figure 17:
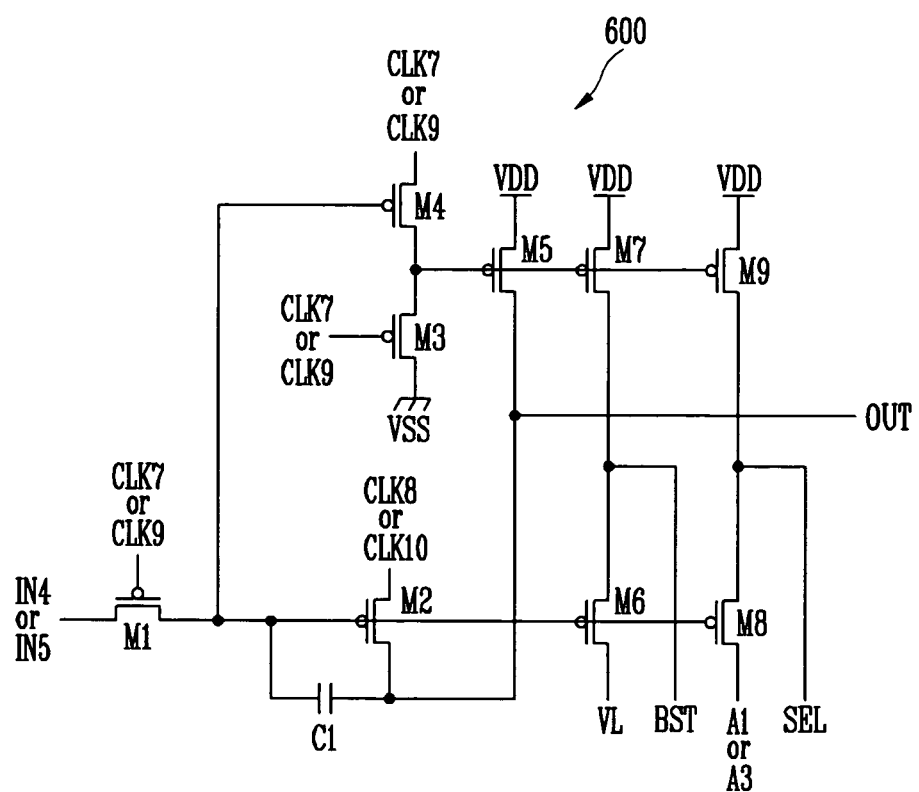
FIG. 17 is a circuit diagram of a stage in a first scan driver of the scan driving circuit according to another embodiment.
Figure 18:
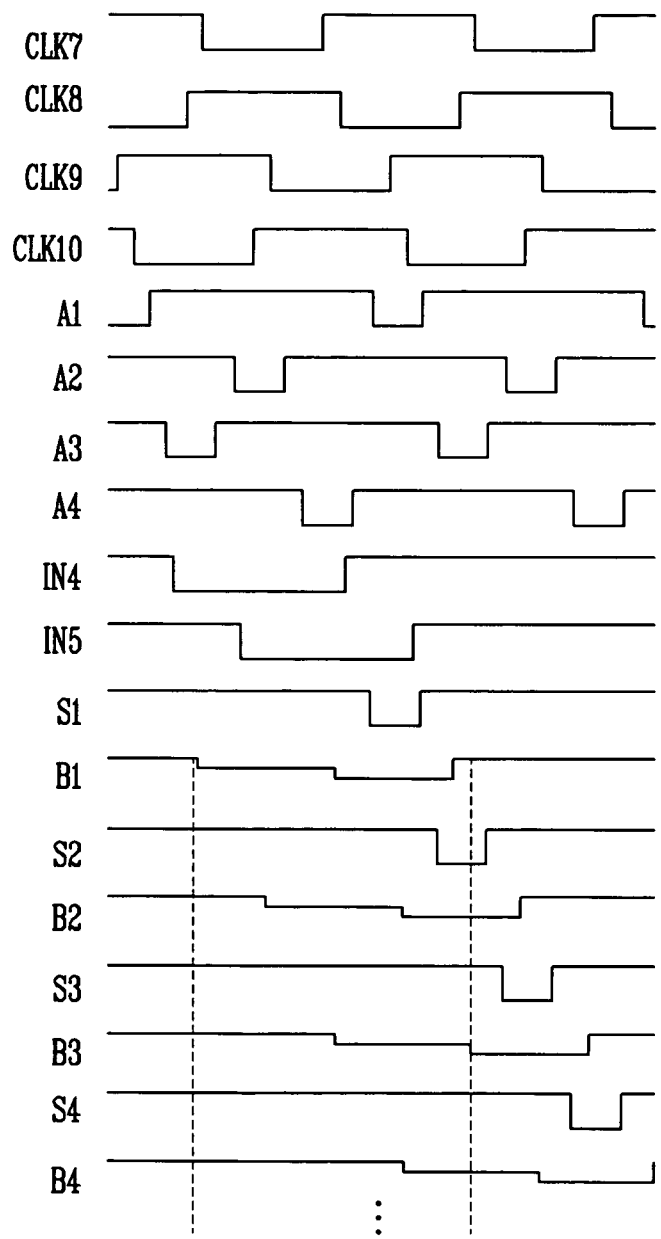
FIG. 18 is an input/output waveform diagram of the stage shown in FIG. 17.

FIG. 17 is a circuit diagram of a stage in a first scan driver of the scan driving circuit, which shows a detailed circuit arrangement of an odd-numbered stage of the first and second scan/boost drive units. FIG. 18 is an input/output waveform diagram of the stage shown in FIG. 17.

As shown in FIG. 17 and FIG. 18, scan/boost drive unit 600 has the same construction as that shown in FIG. 14.

The difference is that a third power supply VL in place of control signals D1, D2, D3, and D4 is applied to an input terminal of a sixth PMOS transistor M6. The third power supply VL supplies a negative voltage corresponding to a low level value of the control signal. In this case, as shown in FIG. 18, the fourth embodiment can still obtain an output waveform similar to that of the third embodiment.

As apparent from the above description, in accordance with a scan driving circuit with a first scan driver for providing a selection signal and/or a boost signal, and a second scan driver for providing an emission signal, by freely adjusting a pulse width and a swing of the boost signal, an electric current $I_{OLED}$ supplied to an organic light emitting diode can be set at a desired value.

Furthermore, a flow path of a static current is removed from the scan driving circuit that allows power consumption to be reduced.

In addition, when the scan driving circuit outputs a high-level signal, an output terminal is not charged, thereby minimizing a leakage current. When the scan driving circuit outputs a low-level signal, a reduction of an electric current charging the output terminal is minimized to increase an operation speed.

Although a few embodiments of the present invention have been shown and described, it would be appreciated by those skilled in the art that changes might be made in this embodiment without departing from the principles and spirit of the invention.

What is claimed is:

1. A scan driving circuit coupled with an input signal line, and comprising a plurality of stages each coupled with a clock signal input line, the circuit comprising:
    a first scan driver configured to sequentially output at least one of a selection signal and a boost signal through two or more of the plurality of stages; and
    a second scan driver configured to sequentially output an emission signal through two or more of the plurality of stages, wherein the first scan driver comprises:
  a scan drive unit configured to output the selection signal;
  a first boost drive unit configured to output an odd-numbered boost signal according to a clock signal on a clock signal line; and
  a second boost drive unit configured to output an even-numbered boost signal according to another clock signal on another clock signal line, wherein the clock signal line for the first boost drive unit is different from the clock signal line for the second boost drive unit.

2. The scan driving circuit as claimed in claim 1, wherein each of the plurality of stages comprise:
  a first transistor configured to receive an output voltage of a previous stage or a first input signal, comprising a gate terminal coupled with a first clock terminal;
  a second transistor coupled with a second clock terminal and an output line, comprising a gate terminal coupled with an output terminal of the first transistor;
  a third transistor coupled between a second power supply and a first node, comprising a gate terminal coupled with the first clock terminal;
  a fourth transistor coupled with the first clock terminal and the first node, comprising a gate terminal coupled with the output terminal of the first transistor; and
  a fifth transistor coupled between a first power supply and the output line, comprising a gate terminal coupled with the first node.

3. The scan driving circuit as claimed in claim 2, further comprising a first capacitor coupled between the output terminal of the first transistor and the output line.

4. The scan driving circuit as claimed in claim 1, further comprising first and second clock signal lines configured to supply first and second phase inverted clock signals to the plurality of stages, wherein each stage of the plurality of stages comprises first and second clock terminals configured to receive the first and second phase inverted clock signals, wherein parts of high levels of the first inverted clock signal overlap parts of high levels of the second phase inverted clock signal.

5. The scan driving circuit as claimed in claim 4, wherein the first clock signal and the second clock signal are supplied to the first and second clock terminals of odd-numbered stages of the plurality of stages.

6. The scan driving circuit as claimed in claim 5, wherein the scan driving circuit is configured to perform a precharge operation during an input time period of the first clock signal having a low level and the second clock signal having a high level, and to perform an evaluation operation during an input time period of the first clock signal having a high level and the second clock signal having a low level.

7. The scan driving circuit as claimed in claim 6, configured to:
  output a high level during a precharge period;
  output a signal having a level corresponding to an input received during the precharge period, during an evaluation period;
  to maintain the output signal level when the first and second clock signals each have a high level following a precharge period; and
  to output a high level signal when the first and second clock signals each have a high level following an evaluation period.

8. The scan driving circuit as claimed in claim 4, wherein the first and second clock signals are supplied to the first and second clock terminals of even-numbered stages of the plurality of stages.

9. The scan driving circuit as claimed in claim 7, wherein the scan driving circuit is configured to perform a precharge operation during an input time period of the first clock signal having a high level and the second clock signal having a low level, and to perform an evaluation operation during an input time period of the first clock signal having a low level and the second clock signal having a high level.

10. The scan driving circuit as claimed in claim 9, configured to:
  output a high level during a precharge period;
  output a signal having a level corresponding to an input received during the precharge period, during an evaluation period;
  to maintain the output signal level when the first and second clock signals each have a high level following a precharge period; and
  to output a high level signal when the first and second clock signals each have a high level following an evaluation period.

11. The scan driving circuit as claimed in claim 1, further comprising first, second, third, and fourth clock signal lines configured to supply first and second phase inverted clock signals and third and fourth phase inverted clock signals, wherein the first and second boost drive units comprises even- and odd-numbered stages, first, second, third, and fourth clock terminals, the circuit configured to receive the first and second phase inverted clock signals and the third and fourth phase inverted clock signals, wherein parts of high levels of the first inverted clock signal overlap parts of high levels of the second phase inverted clock signal, and parts of high levels of the third inverted clock signal overlap parts of high levels of the fourth phase inverted clock signal.

12. The scan driving circuit as claimed in claim 11, further comprising fifth and sixth clock signal lines configured to supply fifth and sixth phase inverted clock signals wherein the third and fifth clock signals are supplied to first clock terminals of odd-numbered stages of the first and second boost drive units, and the fourth and sixth clock signals are supplied to second clock terminals of the odd-numbered stages of the first and second boost drive units.

13. The scan driving circuit as claimed in claim 11, further comprising fifth and sixth clock signal lines configured to supply fifth and sixth phase inverted clock signals, wherein the fourth and sixth clock signals are supplied to first clock terminals of even-numbered stages of the first and second boost drive units, and the third and fifth clock signals are supplied to second clock terminals of the even-numbered stages of the first and second boost drive units.

14. The scan driving circuit as claimed in claim 11, further comprising fifth and sixth clock signal lines configured to supply fifth and sixth phase inverted clock signals, wherein the parts of high levels of the first inverted clock signal overlapping the parts of high levels of the second phase inverted clock signal have a longer duration than the parts of high levels of the third inverted clock signal overlapping the parts of high levels of the fourth phase inverted clock signal.

15. The scan driving circuit as claimed in claim 11, further comprising fifth and sixth clock signal lines configured to supply fifth and sixth phase inverted clock signals, wherein the third and fourth clock signals and a second input signal are input to a stage of the first boost drive unit, and the fifth and sixth clock signals and a third input signal are input to a stage of the second boost drive unit, wherein the fifth clock signal is substantially a version of the third clock signal delayed by one horizontal period, the sixth clock signal is substantially a version of the fourth clock signal delayed by one horizontal period, and the third input signal is substantially a version of the second input signal delayed by one horizontal period.

16. The scan driving circuit as claimed in claim 14, wherein the second and third input signals have low level of greater duration than a first input signal input to the scan drive unit.

17. The scan driving circuit as claimed in claim 2, wherein a stage of the first and second boost drive units further comprises:
    a sixth transistor coupled to a control signal input line and a boost signal output line, comprising a gate terminal coupled with an output terminal of the first transistor; and
    a seventh transistor coupled between the first power supply and the boost signal output line, comprising a gate terminal being coupled with the first node.

18. The scan driving circuit as claimed in claim 16, further comprising first and third control signal lines configured to supply first and third control signals to odd-numbered stages of the first and second boost drive units, and second and fourth control signal lines configured to supply second and fourth control signals to even-numbered stages of the first and second boost drive units.

19. The scan driving circuit as claimed in claim 18, configured to supply the first and second control signals, and the third and fourth clock signals to the first boost drive unit, wherein the voltage difference between high and low values of each of the first and second control signals is less than the difference between high and low values of each of the third and fourth clock signals.

20. The scan driving circuit as claimed in claim 18, configured to supply the third and fourth control signals, and the fifth and sixth clock signals to the second boost drive unit, wherein the voltage difference between high and low values of each of the third and fourth control signals is less than the difference between high and low values of each of the clock signals.

21. A scan driving circuit coupled with an input signal line and comprising a plurality of stages coupled with a two-phase clock signal input line, the circuit comprising:
    a first scan driver configured to sequentially output at least one of a selection signal and a boost signal through two or more of the plurality of stages; and
    a second scan driver configured to output an emission signal through two or more of the plurality of stages,
    wherein the first scan driver comprises:
    a first scan/boost drive unit configured to output odd-numbered selection and boost signals according to a clock signal on a clock signal line; and
    a second scan/boost drive unit configured to output even-numbered selection and boost signals according to another clock signal on another clock signal line, wherein the clock signal line for the first scan/boost drive unit is different from the clock signal line for the second scan/boost drive unit.

22. The scan driving circuit as claimed in claim 21, wherein the first and second scan/boost drive units each comprise at least one stage comprising:
    a first transistor configured to receive an output voltage of a previous stage or a first input signal, the first transistor comprising a gate terminal coupled with a first clock terminal;
    a second transistor coupled with a second clock terminal and an output line, the second transistor comprising a gate terminal coupled with an output terminal of the first transistor;
    a third transistor coupled between a second power supply and a first node, the third transistor comprising a gate terminal coupled with the first clock terminal;
    a fourth transistor coupled with the first clock terminal and the first node, the fourth transistor comprising a gate terminal coupled with the output terminal of the first transistor;
    a fifth transistor coupled between a first power supply and the output line, the fifth transistor comprising a gate terminal coupled with the first node;
    a sixth transistor coupled to a control signal input line and a boost signal output line, the sixth transistor comprising a gate terminal being coupled with an output terminal of the first transistor;
    a seventh transistor coupled between the first power supply and the boost signal output line, the seventh transistor comprising a gate terminal being coupled with the first node;
    an eighth transistor coupled to a selection control signal input line and a selection signal output line, the eighth transistor comprising a gate terminal being coupled to an output terminal of the first transistor; and
    a ninth transistor coupled between the first power supply and the selection signal output line, the ninth transistor comprising a gate terminal being coupled to the first node.

23. The scan driving circuit as claimed in claim 22, further comprising a first capacitor coupled between the output terminal of the first transistor and the output line.

24. The scan driving circuit as claimed in claim 22, wherein the at least one stage is configured to receive a control signal so as to adjust a swing of a boost signal pulse.

25. The scan driving circuit as claimed in claim 22, further comprising a third power supply configured to supply a negative voltage to the control signal input line.

26. The scan driving circuit as claimed in claim 22, configured to apply a selection control signal to the selection control signal input line, and to sequentially output odd- and even-numbered selection signals in response to the selection control signal.

27. An organic light emitting display comprising:
    a pixel portion comprising a plurality of pixels coupled to selection signal lines, data lines, emission signal lines, and boost signal lines;
    a data driving circuit configured to provide a data signal to the data lines; and
    a scan driving circuit coupled with an input signal line, and comprising a plurality of stages coupled with a two-phase clock signal input line, the scan driving circuit comprising:
    a first scan driver configured to sequentially output at least one of a selection signal and a boost signal through two or more of the plurality of stages; and
    a second scan driver configured to sequentially output an emission signal through two or more of the plurality of stages,
    wherein the first scan driver comprises:
    a scan drive unit configured to output the selection signal;
    a first boost drive unit configured to output an odd-numbered boost signal according to a clock signal on a clock signal line; and a second boost drive unit configured to output an even-numbered boost signal according to another clock signal on another clock signal line, wherein the clock signal line for the first boost drive unit is different from the clock signal line for the second boost drive unit.

28. An organic light emitting display comprising:

a pixel portion comprising a plurality of pixels coupled to selection signal lines, data lines, emission signal lines, and boost signal lines;

a data driving circuit configured to provide a data signal to the data lines; and a scan driving circuit coupled with an input signal line and comprising a plurality of stages coupled with a two-phase clock signal input line, the scan driving circuit comprising:

- a first scan driver configured to sequentially output at least one of a selection signal and a boost signal through two or more of the plurality of stages; and a second scan driver configured to output an emission signal through two or more of the plurality of stages, wherein the first scan driver comprises:

- a first scan/boost drive unit configured to output odd-numbered selection and boost signals according to a clock signal on a clock signal line; and
- a second scan/boost drive unit configured to output even-numbered selection and boost signals according to another clock signal on another clock signal line, wherein the clock signal line for the first scan/boost drive unit is different from the clock signal line for the second scan/boost drive unit.

\* \* \* \* \*